United States Patent
Yoshino et al.

(10) Patent No.: US 11,851,638 B2
(45) Date of Patent: Dec. 26, 2023

(54) SURFACE TREATMENT COMPOSITION, METHOD FOR PRODUCING SURFACE TREATMENT COMPOSITION, SURFACE TREATMENT METHOD, AND METHOD FOR PRODUCING SEMICONDUCTOR SUBSTRATE

(71) Applicant: FUJIMI INCORPORATED, Kiyosu (JP)

(72) Inventors: Tsutomu Yoshino, Kiyosu (JP); Sonosuke Ishiguro, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 114 days.

(21) Appl. No.: 17/392,696

(22) Filed: Aug. 3, 2021

(65) Prior Publication Data

US 2022/0098523 A1 Mar. 31, 2022

(30) Foreign Application Priority Data

Sep. 25, 2020 (JP) .................................. 2020-161242

(51) Int. Cl.
| | | |
|---|---|---|
| *C11D 3/37* | (2006.01) | |
| *C11D 1/00* | (2006.01) | |
| *C11D 3/36* | (2006.01) | |
| *C11D 11/00* | (2006.01) | |
| *H01L 21/02* | (2006.01) | |

(52) U.S. Cl.
CPC ............ *C11D 3/3773* (2013.01); *C11D 1/008* (2013.01); *C11D 3/365* (2013.01); *C11D 11/0047* (2013.01); *H01L 21/02074* (2013.01)

(58) Field of Classification Search
CPC ................................................ C11D 11/0047
USPC ........................................................ 510/175
See application file for complete search history.

(56) References Cited

U.S. PATENT DOCUMENTS

| | | |
|---|---|---|
| 8,765,653 B2 | 7/2014 | Tamboli et al. |
| 10,781,410 B2 | 9/2020 | Ishida et al. |
| 11,603,512 B2 * | 3/2023 | Mishra .............. H01L 21/02057 |
| 2005/0284844 A1 | 12/2005 | Hattori et al. |
| 2011/0136717 A1 | 6/2011 | Tamboli et al. |
| 2013/0174867 A1 | 7/2013 | Harada |
| 2019/0085271 A1 | 3/2019 | Ishida et al. |
| 2019/0256805 A1 | 8/2019 | Goto et al. |
| 2021/0284930 A1 | 9/2021 | Hirano et al. |
| 2021/0292685 A1 * | 9/2021 | Mishra ................... C11D 7/265 |

FOREIGN PATENT DOCUMENTS

| | | |
|---|---|---|
| EP | 2 284 250 A1 | 2/2011 |
| JP | 2012-074678 A | 4/2012 |
| KR | 10-2019-0032179 A | 3/2019 |
| WO | WO-2018/062053 A1 | 4/2018 |

OTHER PUBLICATIONS

European Search Report for EP Appl. Ser. No. 21 192 240.6 dated Feb. 7, 2022 (8 pages).

* cited by examiner

*Primary Examiner* — Gregory E Webb
(74) *Attorney, Agent, or Firm* — Foley & Lardner LLP

(57) ABSTRACT

Provided is a means capable of sufficiently removing organic residues on the surface of an object to be polished after polishing. A surface treatment composition includes a polymer having a building block represented by Formula (1) in [Chemical Formula 1], a chelating agent, and water and is used to treat the surface of an object to be polished after polishing, and the chelating agent has at least one of a phosphonic acid group and a carboxylic acid group.

[Chemical Formula 1]

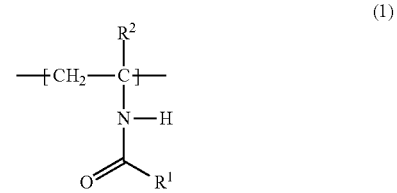

(1)

In Formula (1), $R^1$ is a hydrocarbon group having 1 to 5 carbon atoms; and $R^2$ is a hydrogen atom or a hydrocarbon group having 1 to 3 carbon atoms.

20 Claims, No Drawings

SURFACE TREATMENT COMPOSITION, METHOD FOR PRODUCING SURFACE TREATMENT COMPOSITION, SURFACE TREATMENT METHOD, AND METHOD FOR PRODUCING SEMICONDUCTOR SUBSTRATE

CROSS-REFERENCE TO RELATED APPLICATIONS

This application claims priority to Japanese Patent Application No. 2020-161242, filed on Sep. 25, 2020, the disclosure of which is herein incorporated by reference in its' entirety.

BACKGROUND OF THE INVENTION

Field of the Invention

The present invention relates to a surface treatment composition, a method for producing a surface treatment composition, a surface treatment method, and a method for producing a semiconductor substrate.

Description of the Related Art

Due to recent multi-layer wiring on the surface of a semiconductor substrate, what is called chemical mechanical polishing (CMP) in which a semiconductor substrate is polished for planarization has been used to produce semiconductor devices. The CMP is a method for planarizing the surface of objects to be polished (polishing objects) such as semiconductor substrates by using a polishing composition (slurry) containing abrasives such as silica, alumina, and ceria, an anticorrosive, a surfactant, and other components. Examples of the object to be polished (polishing object) include wirings and plugs containing silicon, polysilicon, a silicone oxide film (silicon oxide), silicon nitride, a metal, or the like.

On the surface of a semiconductor substrate after the CMP step, a lot of impurities (defects) remain. The impurities include abrasives, a metal, an anticorrosive, and organic substances such as a surfactant derived from the polishing composition used in CMP, a silicon-containing material of an object to be polished, a silicon-containing material and a metal generated by polishing a metal wiring, a plug, or the like, and organic substances such as pad dusts derived from various pads.

If the surface of a semiconductor substrate were contaminated with such impurities, electrical properties of the semiconductor could be adversely affected to reduce the reliability of the semiconductor device. Hence, a cleaning step is preferably performed after the CMP step to remove such impurities from the surface of a semiconductor substrate.

As a cleaning liquid (cleaning composition) used in such a cleaning step, for example, the cleaning liquid disclosed in PTL 1 has been known. PTL 1 discloses a slurry composition for chemical mechanical polishing, and the composition includes water, polishing abrasives, and at least one water-soluble polymer having a polyvinyl alcohol structural unit.

CITATION LIST

Patent Literature

PTL 1: JP 2012-74678 A

SUMMARY OF THE INVENTION

In cleaning an object to be polished after polishing, defects are required to be further reduced.

The inventors of the present invention have studied the relation between the types of objects to be polished after polishing and the types of defects. As a result, we have found that on the surface of an object to be polished after polishing (for example, a polished semiconductor substrate) containing silicon oxide, silicon nitride, or polysilicon, ceria particles contained in a polishing composition or organic residues are likely to remain, and these residues can cause a semiconductor device to break.

To solve the problems, an object of the present invention is to provide a means capable of sufficiently removing ceria particles or organic residues on the surface of an object to be polished after polishing.

Solution to Problem

The inventors of the present invention have carried out intensive studies to solve the problems. As a result, we have found that use of a surface treatment composition containing a polymer having a building block represented by Formula (1) in [Chemical Formula 1], a chelating agent, and water enables sufficient removal of organic residues on the surface of an object to be polished after polishing containing silicon oxide or polysilicon, and have completed the present invention.

[Chemical Formula 1]

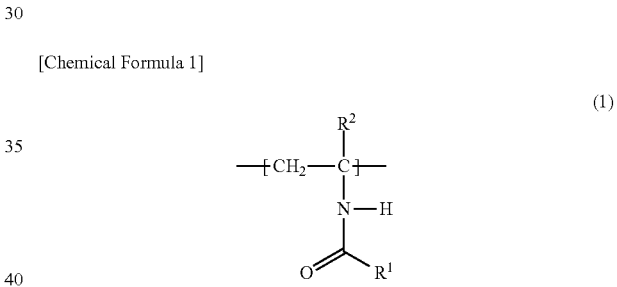

In Formula (1), $R^1$ is a hydrocarbon group having 1 to 5 carbon atoms; and $R^2$ is a hydrogen atom or a hydrocarbon group having 1 to 3 carbon atoms. The chelating agent has at least one of a phosphonic acid group and a carboxylic acid group.

Advantageous Effects of Invention

According to the present invention, a means capable of sufficiently removing ceria particles or organic residues on the surface of an object to be polished after polishing is provided.

DESCRIPTION OF THE PREFERRED EMBODIMENTS

The present invention will now be described. The present invention is not necessarily limited to the following embodiments.

In the present description, the expression "(meth)acrylic" in a specific compound name means "acrylic" and "methacrylic", and the expression "(meth)acrylate" means "acrylate" and "methacrylate".

[Organic Residue]

In the present description, an organic residue is a component including an organic substance and an organic salt, such as a low-molecular organic compound and a polymer compound, of contaminants adhering to the surface of an object to be polished after polishing.

Examples of the organic residue adhering to an object to be cleaned include pad dusts generated from a pad used in the polishing step or the optional rinse polishing step described later and components derived from an additive contained in a polishing composition used in the polishing step or in a rinse polishing composition used in the rinse polishing step.

The organic residue greatly differs from other contaminants in color and shape, and thus whether a contaminant is an organic residue or not can be visually determined by SEM observation or, as needed, can be determined by elementary analysis with an energy-dispersive X-ray analyzer (EDX).

[Object to be Polished after Polishing]

In the present description, the object to be polished after polishing is an object to be polished after polishing in a polishing step. The polishing step is not specifically limited and is preferably a CMP step.

A surface treatment composition pertaining to an embodiment of the present invention is preferably used to reduce ceria ($CeO_2$) particles or organic residues remaining on the surface of an object to be polished after polishing (hereinafter also simply called "object to be cleaned") containing silicon oxide, silicon nitride (hereinafter also simply called "SiN"), or polysilicon (hereinafter also simply called "Poly-Si"). Examples of the object to be polished after polishing containing silicon oxide include a TEOS type silicon oxide surface (hereinafter also simply called "TEOS") formed by using tetraethyl orthosilicate as a precursor, an HDP film, an USG film, a PSG film, a BPSG film, and an RTO film.

The object to be polished after polishing is preferably a polished semiconductor substrate and more preferably a semiconductor substrate after CMP. This is because specifically ceria particles or organic residues can cause a semiconductor device to break, and thus when the object to be polished after polishing is a polished semiconductor substrate, ceria particles or organic residues should be removed as much as possible in the cleaning step of the semiconductor substrate.

Examples of the object to be polished after polishing containing silicon oxide, silicon nitride, or polysilicon include, but are not necessarily limited to, objects to be polished after polishing each composed of silicon oxide, silicon nitride, or polysilicon alone and objects to be polished after polishing containing silicon oxide, silicon nitride, or polysilicon and having a surface on which an additional material is exposed. Examples of the former object include a silicon oxide substrate, a silicon nitride substrate, and a polysilicon substrate as conductor substrates. As for the latter object, examples of the additional material except silicon oxide, silicon nitride, or polysilicon include tungsten but are not necessarily limited thereto. Specific examples of such an object to be polished after polishing include a polished semiconductor substrate in which a silicon oxide film, a silicon nitride film, or a polysilicon film is formed on tungsten and a polished semiconductor substrate on which a tungsten portion, a silicon oxide film, a silicon nitride film, and a polysilicon film are all exposed.

In the description, from the viewpoint of advantageous effects by the present invention, the object to be polished after polishing pertaining to an embodiment of the present invention preferably contains silicon oxide.

[Surface Treatment Composition]

An embodiment of the present invention is a surface treatment composition that includes a polymer having a building block represented by Formula (1) in [Chemical Formula 2], a chelating agent, and water and is used to treat the surface of an object to be polished after polishing.

[Chemical Formula 2]

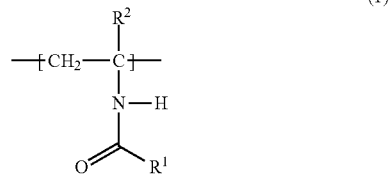

In Formula (1), $R^1$ is a hydrocarbon group having 1 to 5 carbon atoms; and $R^2$ is a hydrogen atom or a hydrocarbon group having 1 to 3 carbon atoms. The chelating agent has at least one of a phosphonic acid group and a carboxylic acid group.

The surface treatment composition pertaining to an embodiment of the present invention is particularly preferably used as an organic residue reduction agent for selectively removing ceria particles or organic residues in a surface treatment step.

The inventors of the present invention suppose the mechanism to solve the above problems by the present invention as follows. The surface treatment composition has the following function: each component contained in the surface treatment composition interacts with the surface of an object to be polished after polishing and with contaminants; and the resulting chemical interaction consequently removes contaminants on the surface of an object to be polished after polishing or facilitates the removal.

The polymer having a building block represented by Formula (1) can physically adsorb to a hydrophobic wafer surface to change the surface into a hydrophilic surface. Organic residues adhering onto the wafer once float during the treatment, and then the above polymer adsorbs to the wafer. As a result, a layer formed from the polymer functions as a layer for preventing organic residues from re-adhering, and accordingly the organic residues can be easily removed from the wafer.

The chelating agent having at least one of a phosphonic acid group and a sulfonic acid group can more effectively remove organic residues especially from an object to be polished after polishing containing silicon oxide (for example, TEOS).

The chelating agent having at least one of a phosphonic acid group and a sulfonic acid group can dissolve and remove ceria particles on the surface of an object to be polished after polishing. In particular, a chelating agent having a phosphonic acid group has a high function of dissolving ceria particles.

When the surface treatment composition contains an ionic dispersant, organic residues can be more effectively removed not only from an object to be polished after polishing containing silicon oxide (for example, TEOS) but also from an object to be polished after polishing containing silicon nitride.

The above mechanism is based on a supposition, and whether the supposition is true or not does not affect the technical scope of the present invention.

The components contained in the surface treatment composition will next be described.

[Polymer Having Building Block Represented by Formula (1)]

Examples of the hydrocarbon group having 1 to 5 carbon atoms represented by $R^1$ in Formula (1) include alkyl groups such as a methyl group, an ethyl group, and a propyl group; alkenyl groups such as an ethenyl group and a propenyl group; alkynyl groups such as an ethynyl group and a propynyl group; and cycloalkyl groups such as a cyclopentyl group. Of them, an alkyl group and an alkynyl group are preferred, and a hydrocarbon group having 1 to 3 carbon atoms is also preferred. As $R^1$, a methyl group, an ethyl group, and an ethenyl group (vinyl group) are more preferred, and a methyl group and an ethyl group are even more preferred.

Examples of the hydrocarbon group having 1 to 3 carbon atoms represented by $R^2$ in Formula (1) include hydrocarbon groups having 1 to 3 carbon atoms of those exemplified as the hydrocarbon groups having 1 to 5 carbon atoms represented by $R^1$. As $R^2$, a hydrogen atom and a methyl group are preferred.

Examples of the unsaturated monomer to give the building block include N-vinylacetamide, N-vinylpropionamide, and N-vinylbutyramide, and N-vinylacetamide and N-vinylpropionamide are preferred. The above unsaturated monomers can be used singly or as a mixture of two or more of them.

The polymer typically has a weight average molecular weight (Mw) of 30,000 or more and 1,000,000 or less, preferably 50,000 or more and 900,000 or less, and more preferably 50,000 or more and 100,000 or less. When the polymer has a weight average molecular weight (Mw) within the above range, organic residues on the surface of an object to be polished after polishing can be more effectively reduced.

The lower limit of the content of the polymer having a building block represented by Formula (1) (when two or more polymers are contained, the total content thereof) is not specifically limited and is preferably 0.02% by mass or more relative to the total amount of the surface treatment composition. When the content is 0.02% by mass or more, organic residues on the surface of an object to be polished after polishing can be more effectively reduced. From a similar viewpoint, the lower limit of the content of the polymer having a building block represented by Formula (1) is more preferably 0.03% by mass or more and even more preferably 0.05% by mass or more relative to the total amount of the surface treatment composition. The upper limit of the content of the polymer having a building block represented by Formula (1) is preferably 1% by mass or less relative to the total amount of the surface treatment composition. When the content is 1% by mass or less, the polymer having a building block represented by Formula (1) itself is easily removed after surface treatment. From a similar viewpoint, the upper limit of the content of the polymer having a building block represented by Formula (1) is more preferably 0.7% by mass or less and even more preferably 0.5% by mass or less relative to the total amount of the surface treatment composition.

The content of the building block in the polymer is preferably 30% by mole or more and 100% by mole or less, more preferably 50% by mole or more and 100% by mole or less, and even more preferably 70% by mole or more and 100% by mole or less. When the content of the building block is within the above range, organic residues on the surface of an object to be polished after polishing can be more effectively reduced.

[Chelating Agent]

The chelating agent has at least one of a phosphonic acid group and a carboxylic acid group. In other words, the chelating agent may have only a phosphonic acid group, only a carboxylic acid group, or both a phosphonic acid group and a carboxylic acid group.

The chelating agent forms, together with metal impurities containable in the surface treatment composition, complex ions to trap the metal impurities and accordingly functions to prevent the metal impurities from contaminating an object to be polished after polishing. Examples of the chelating agent having a phosphonic acid group (hereinafter also called "phosphonic acid chelating agent") include 1-hydroxyethylidene-1,1-diphosphonic acid (HEDP), nitrilotris (methylenephosphonic acid) (ATMP), ethylenediaminetetra (methylenephosphonic acid) (EDTMP), sodium hexametaphosphate, and 2-phosphonobutane-1,2,4-tricarboxylic acid (PBTC). Examples of the chelating agent having a carboxylic acid group (hereinafter also called "carboxylic acid chelating agent") include triethylenetraminehexaacetic acid (TTHA), ethylenediaminetetraacetic acid (EDTA), diethylenetriaminepentaacetic acid (DTPA), ethylenediamine-N,N'-disuccinic acid (EDDS), succinic acid, glutaric acid, citric acid, and mercaptosuccinic acid.

The phosphonic acid chelating agent and the carboxylic acid chelating agent are not limited to the above examples and may be the following examples.

Examples of the phosphonic acid chelating agent include 2-aminoethylphosphonic acid, 1-hydroxyethylidene-1,1-diphosphonic acid, aminotri(methylenephosphonic acid), ethylenediamine tetrakis(methylenephosphonic acid) (EDTPO), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid. Of them, preferred examples include EDTPO, diethylenetriaminepenta(methylenephosphonic acid), and diethylenetriaminepentaacetic acid. Specifically preferred examples of the phosphonic acid chelating agent include EDTPO and diethylenetriaminepenta(methylenephosphonic acid). Examples of the carboxylic acid chelating agent include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetraminehexaacetic acid, and sodium triethylenetetraminehexaacetate. The chelating agents can be used singly or in combination of two or more of them.

[Water-Soluble Polymer Having Building Block Derived from Glycerol]

The surface treatment composition pertaining to an embodiment of the present invention may contain a water-soluble polymer having a building block derived from glycerol.

Preferred examples of the water-soluble polymer having a building block derived from glycerol include at least one selected from the group consisting of polyglycerols (see Formula (2)), alkyl (C10-14) esters of polyglycerols, polyglycerol alkyl (C10-14) ethers, ethylene oxide-modified polyglycerols, sulfonic acid-modified polyglycerols (for example, see Formulae (3), (4)), and phosphonic acid-modified polyglycerols (for example, see Formula (5), (6)).

[Chemical Formula 3]

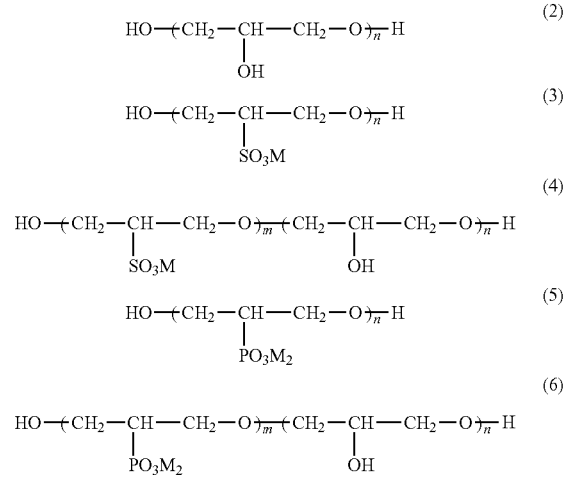

In Formulae (2) to (6), m and n are each independently the number of repeating units, and in Formulae (3) to (6), each M is independently a hydrogen atom, Na, K, or $NH_4^+$.

In Formulae (3) to (6), a plurality of Ms may be the same or different. For example, in Formula (3), n pieces of Ms may be each Na or may be a combination of two or more of a hydrogen atom, Na, K, and $NH_4^+$. For example, in Formula (4), m pieces of Ms may be each Na or may be a combination of two or more of a hydrogen atom, Na, K, and $NH_4^+$.

The water-soluble polymers having a building block derived from glycerol can be used singly or in combination of two or more of them.

The content (concentration) of the water-soluble polymer having a building block derived from glycerol (when two or more polymers are contained, the total content thereof) is not specifically limited and is preferably 0.02% by mass or more relative to the total amount of the surface treatment composition. When the content of the water-soluble polymer having a building block derived from glycerol is 0.02% by mass or more, advantageous effects of the invention are improved.

From a similar viewpoint, the content (concentration) of the water-soluble polymer having a building block derived from glycerol is more preferably 0.03% by mass or more and even more preferably 0.05% by mass or more relative to the total amount of the surface treatment composition. The content (concentration) of the water-soluble polymer having a building block derived from glycerol is preferably 1% by mass or less relative to the total amount of the surface treatment composition. When the content (concentration) of the water-soluble polymer having a building block derived from glycerol is 1% by mass or less, the water-soluble polymer having a building block derived from glycerol itself is easily removed after surface treatment. From a similar viewpoint, the content (concentration) of the water-soluble polymer having a building block derived from glycerol is more preferably 0.7% by mass or less and even more preferably 0.5% by mass or less relative to the total amount of the surface treatment composition.

The water-soluble polymer having a building block derived from glycerol preferably has a weight average molecular weight (Mw) of 1,000 or more. When the weight average molecular weight is 1,000 or more, the contaminant removal effect is further improved. This is supposedly because such a water-soluble polymer having a building block derived from glycerol has higher coatability when applied onto an object to be cleaned or contaminants, and properties of removing contaminants from the surface of an object to be cleaned or properties of preventing contaminants from re-adhering to the surface of an object to be cleaned are further improved. From a similar viewpoint, the weight average molecular weight is more preferably 3,000 or more and even more preferably 8,000 or more. The upper limit of the weight average molecular weight of the water-soluble polymer having a building block derived from glycerol is not specifically limited and is preferably 1,000,000 or less, more preferably 100,000 or less, and even more preferably 50,000 or less. The weight average molecular weight can be determined by gel permeation chromatography (GPC) by using a GPC apparatus (manufactured by Shimadzu Corporation, type: Prominence+ELSD detector (ELSD-LTII)) or the like in terms of polyethylene glycol, and specifically can be determined in accordance with the method described in examples.

The water-soluble polymer having a building block derived from glycerol may be a commercial product or a synthesized product. For synthesis, the production method is not specifically limited, and a known polymerization method can be used.

[Acid]

The surface treatment composition pertaining to an embodiment of the present invention may contain an acid. In the present description, the ionic dispersant described later is different from the acid described here as an additive. The acid is added mainly for adjusting the pH of the surface treatment composition.

The acid supposedly functions to make the surface of an object to be polished after polishing or the surface of contaminants positively charged when the object to be polished after polishing contains silicon oxide, silicon nitride, or polysilicon. Hence, when the surface treatment composition is used for contaminants or an object to be cleaned capable of being positively charged, addition of an acid further facilitates an electrostatic repulsion effect and further improves the contaminant removal effect by the surface treatment composition.

The acid may be either an inorganic acid or an organic acid. Examples of the inorganic acid include, but are not necessarily limited to, sulfuric acid, nitric acid, boric acid, carbonic acid, hypophosphorous acid, phosphorous acid, and phosphoric acid. Examples of the organic acid include, but are not necessarily limited to, carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, methanesulfonic acid, ethanesulfonic acid, and isethionic acid.

Of them, maleic acid or nitric acid is more preferred from the viewpoint of further improving the function of making the surface of an object to be polished after polishing and the surface of contaminants positively charged and improving the contaminant removal performance.

The acids can be used singly or in combination of two or more of them.

The content of the acid is preferably 0.01% by mass or more relative to the total amount of the surface treatment composition. When the content of the acid is 0.01% by mass or more, the contaminant removal effect is further improved. This is supposedly because such a condition further improves the function of making the surface of an object to be polished after polishing and the surface of contaminants positively charged. From a similar viewpoint, the content of the acid is more preferably 0.02% by mass or more and even more preferably 0.03% by mass or more relative to the total amount of the surface treatment composition. The content of the acid is preferably 5% by mass or less relative to the total amount of the surface treatment composition. When the content of the acid is 5% by mass or less, the cost can be advantageously reduced. From a similar viewpoint, the content of the acid is more preferably 3% by mass or less and even more preferably 1% by mass or less relative to the total amount of the surface treatment composition.

[Dispersion Medium]

The surface treatment composition pertaining to an embodiment of the present invention essentially contains water as a dispersion medium (solvent). The dispersion medium functions to disperse or dissolve the components. The dispersion medium is more preferably water alone. The dispersion medium may be a mixed solvent of water and an organic solvent in order to disperse or dissolve each component. In this case, examples of the organic solvent used include organic solvents miscible with water, such as acetone, acetonitrile, ethanol, methanol, isopropanol, glycerol, ethylene glycol, and propylene glycol. Such an organic solvent not mixed with water may be used to disperse or dissolve each component, and the resulting liquid may be mixed with water. These organic solvents can be used singly or in combination of two or more of them.

The water is preferably a water free of impurities as much as possible from the viewpoint of preventing contamination of an object to be cleaned or action on other components. For example, a water containing transition metal ions at a total content of 100 ppb or less is preferred. In the description, the water purity can be improved, for example, by removal of impurity ions with an ion exchange resin, removal of contaminants with a filter, distillation, and other methods. Specifically, the water is preferably deionized water (ion-exchanged water), pure water, ultrapure water, or distilled water, for example.

[pH]

The pH of the surface treatment composition pertaining to an embodiment of the present invention may exceed 5 and is preferably 5 or less. When a surface treatment composition having a pH of 5 or less is used for contaminants or an object to be cleaned capable of being positively charged, the surface of the object to be cleaned or the surface of the contaminants can be more certainly, positively charged, and the resulting electrostatic repulsion achieves a higher contaminant removal effect. When the pH exceeds 5, the contaminant removal effect is unlikely to be achieved in a certain condition (for example, on a polished silicon nitride substrate as described later in Example 10). The pH is more preferably 4 or less, even more preferably 3 or less, and furthermore preferably less than 3 (for example, 2.5). The pH of the surface treatment composition is preferably 1 or more. When the pH is 1 or more, the cost can be further reduced.

The pH of a surface treatment composition can be determined with a pH meter (manufactured by Horiba, Ltd., product name: LAQUA (registered trademark)).

In the pH adjustment, it is desirable not to add components other than the surface treatment composition pertaining to an embodiment of the present invention as less as possible because such components can generate contaminants. Hence, the surface treatment composition is preferably prepared from only the water-soluble polymer having a building block derived from glycerol, the acid, the water, and an optional ionic dispersant. However, when an intended pH is difficult to be adjusted only by these components, an additional additive such as an alkali (for example, ammonia) that can be optionally added may be used to adjust the pH as long as advantageous effects of the invention are not impaired.

[Ionic Dispersant]

The surface treatment composition pertaining to an embodiment of the present invention preferably further contains an ionic dispersant. The ionic dispersant helps the surface treatment composition to remove contaminants. Hence, a surface treatment composition containing the ionic dispersant can sufficiently remove contaminants (impurities including organic residues) remaining on the surface of an object to be polished after polishing, in the surface treatment (for example, cleaning) of the object to be polished after polishing.

Examples of the ionic dispersant include a polymer compound having a sulfonic acid (salt) group; a polymer compound having a phosphoric acid (salt) group; a polymer compound having a phosphoric acid (salt) group; a polymer compound having a carboxylic acid (salt) group; nitrogen atom-containing water-soluble polymers such as polyvinylpyrrolidone (PVP), polyvinylimidazole (PVI), polyvinylcarbazole, polyvinylcaprolactam, polyvinylpiperidine, and polyacryloylmorpholine (PACMO); polyvinyl alcohol (PVA); and hydroxyethyl cellulose (HEC).

Of them, a polymer compound having a sulfonic acid (salt) group is preferred. The polymer compound having a sulfonic acid (salt) group will next be described.

<Polymer Compound Having Sulfonic Acid (Salt) Group>

In the surface treatment composition pertaining to an embodiment of the present invention, the ionic dispersant is preferably a polymer compound having a sulfonic acid (salt) group. The polymer compound having a sulfonic acid (salt) group (in the present description, also simply called "sulfonic acid group-containing polymer") is more likely to help the surface treatment composition to remove contaminants. Accordingly, the surface treatment composition containing the sulfonic acid group-containing polymer has an effect of facilitating the removal of contaminants (impurities including organic residues) remaining on the surface of an object to be polished after polishing, in the surface treatment (for example, cleaning) of the object to be polished after polishing.

The sulfonic acid group-containing polymer can form micelles due to the affinity between a moiety other than the sulfonic acid (salt) group (i.e., the polymer chain moiety of the sulfonic acid group-containing polymer) and contaminants (particularly hydrophobic components). It is thus supposed that the micelles are dissolved or dispersed in the surface treatment composition, and accordingly contaminants as hydrophobic components can also be effectively removed.

When an object to be polished after polishing has a cationic surface in an acidic condition, the sulfonic acid group is anionized and is likely to adsorb to the surface of the object to be polished after polishing. As a result, it is supposed that the surface of the object to be polished after polishing is covered with the sulfonic acid group-containing polymer. Meanwhile, to the remaining contaminants (particularly, contaminants likely to be cationized), the sulfonic acid group of the sulfonic acid group-containing polymer is likely to adsorb, and accordingly the contaminants have an anionized surface. Hence, the contaminants having an anionized surface electrostatically repel the anionized sulfonic acid group of the sulfonic acid group-containing polymer that adsorbs to the surface of an object to be polished after polishing. When contaminants are anionic, the contaminants themselves electrostatically repel the anionized sulfonic acid group on an object to be polished after polishing. Hence, it is supposed that use of such an electrostatic repulsion enables effective removal of contaminants.

When an object to be polished after polishing is unlikely to be charged, contaminants are supposedly removed by a different mechanism from the above. First, to a hydrophobic object to be polished after polishing, contaminants (particularly, hydrophobic components) are supposed to be in a condition to readily adhere due to hydrophobic interaction. The polymer chain moiety (hydrophobic structure moiety) of a sulfonic acid group-containing polymer faces the surface of an object to be polished after polishing due to the hydrophobicity, whereas an anionized sulfonic acid group or the like as the hydrophilic structure moiety faces the opposite side to the surface of the object to be polished after polishing. Accordingly, it is supposed that the surface of the object to be polished after polishing is covered with the anionized sulfonic acid group and becomes hydrophilic. As a result, the hydrophobic interaction is difficult to be generated between contaminants (particularly, hydrophobic components) and the object to be polished after polishing, and the contaminants are prevented from adhering.

The polymer having a building block represented by Formula (1), the water-soluble polymer having a building block derived from glycerol, and the sulfonic acid group-containing polymer adsorbing to the surface of an object to be polished after polishing are then easily removed by water cleaning or the like.

In the present description, a "sulfonic acid (salt) group" is a sulfonic acid group ($-SO_3H$)) or a salt group thereof ($-SO_3M^2$, where $M^2$ is an organic or inorganic cation).

The sulfonic acid group-containing polymer may be any polymer having a plurality of sulfonic acid (salt) groups, and a known compound can be used. Examples of the sulfonic acid group-containing polymer include a polymer compound prepared by sulfonation of a base polymer compound and a polymer compound prepared by (co)polymerization of a monomer having a sulfonic acid (salt) group.

More specific examples include sulfonic acid (salt) group-containing polyvinyl alcohols (sulfonic acid-modified polyvinyl alcohols), sulfonic acid (salt) group-containing polystyrenes such as polystyrene sulfonic acid and sodium polystyrene sulfonate, sulfonic acid (salt) group-containing polyvinyl acetates (sulfonic acid-modified polyvinyl acetates), sulfonic acid (salt) group-containing polyesters, and copolymers of a (meth)acrylic group-containing monomer and a sulfonic acid (salt) group-containing monomer, such as a copolymer of (meth)acrylic acid and a sulfonic acid (salt) group-containing monomer. In the present description, the expression "(meth)acrylic" in a specific compound name means "acrylic" and "methacrylic", and the expression "(meth)acrylate" means "acrylate" and "methacrylate". The above sulfonic acid group-containing polymers can be used singly or in combination of two or more of them. At least some of the sulfonic acid groups of such a polymer can be in a salt form. Examples of the salt include alkali metal salts such as a sodium salt and a potassium salt, salts of Group II elements, such as a calcium salt and a magnesium salt, an amine salt, and an ammonium salt. In particular, when the object to be polished after polishing is a semiconductor substrate after a CMP step, an ammonium salt is preferred from the viewpoint of removing metals on the substrate surface to a maximum extent.

When the sulfonic acid group-containing polymer is a sulfonic acid group-containing polyvinyl alcohol, the degree of saponification is preferably 80% or more and more preferably 85% or more (the upper limit: 100%) from the viewpoint of solubility.

In the present invention, the sulfonic acid group-containing polymer preferably has a weight average molecular weight of 1,000 or more. When the weight average molecular weight is 1,000 or more, the contaminant removal effect is further improved. This is supposedly because the coatability is further improved when an object to be polished after polishing or contaminants are covered, and properties of removing contaminants from the surface of an object to be cleaned or properties of preventing organic residues from re-adhering to the surface of an object to be polished after polishing are further improved. From a similar viewpoint, the weight average molecular weight is more preferably 2,000 or more and even more preferably 8,000 or more.

The sulfonic acid group-containing polymer preferably has a weight average molecular weight of 100,000 or less. When the weight average molecular weight is 100,000 or less, the contaminant removal effect is further improved. This is supposedly because the removal performance of the sulfonic acid group-containing polymer after the cleaning step is further improved. From a similar viewpoint, the weight average molecular weight is more preferably 50,000 or less and even more preferably 40,000 or less.

The weight average molecular weight can be determined by gel permeation chromatography (GPC) and specifically can be determined in accordance with the method described in examples.

The sulfonic acid group-containing polymer can be a commercial product, such as GOHSENX (registered trademark) L-3226, GOHSENX (registered trademark) CKS-50 manufactured by The Nippon Synthetic Chemical Industry Co., Ltd., Aron (registered trademark) A-6012, A-6016A, A-6020 manufactured by TOAGOSEI CO., LTD., and Poly NaSS (registered trademark) PS-1 manufactured by Tosoh Organic Chemical Co., Ltd.

The content (concentration) of the sulfonic acid group-containing polymer is preferably 0.001% by mass or more relative to the total amount of the surface treatment composition. When the content of the sulfonic acid group-containing polymer is 0.001% by mass or more, the contaminant removal effect is further improved. This is supposedly because a larger area of an object to be polished after polishing and contaminants is covered with the sulfonic acid group-containing polymer. This especially helps the contaminants to form micelles, and the micelles are dissolved or dispersed to improve the contaminant removal effect. It is also supposed that an increase of the number of sulfonic acid (salt) groups enables stronger expression of the electrostatic adsorption or repulsion effect. From a similar viewpoint, the content (concentration) of the sulfonic acid group-containing polymer is more preferably 0.003% by mass or more and even more preferably 0.005% by mass or more relative to the total amount of the surface treatment composition. The content (concentration) of the sulfonic acid group-containing polymer is preferably 0.5% by mass or less relative to the total amount of the surface treatment composition. When the content (concentration) of the sulfonic acid group-containing polymer is 0.5% by mass or less, the contaminant removal effect is further improved. This is supposedly because the removal performance of the sulfonic acid group-containing polymer itself after the cleaning step is improved. From a similar viewpoint, the content of the sulfonic acid group-containing polymer is more preferably 0.2% by mass or less, even more preferably 0.1% by mass or less, and furthermore preferably 0.05% by mass or less relative to the total amount of the surface treatment composition.

In the present description, the "polymer compound" is a compound having a weight average molecular weight of 1,000 or more.

ADDITIONAL ADDITIVE

The surface treatment composition pertaining to an embodiment of the present invention may contain an additional additive at any content as needed, within a range not impairing advantageous effects of the invention. It is, however, desirable not to add components other than the essential components of the surface treatment composition pertaining to an embodiment of the present invention as less as possible because such components can generate contaminants. It is therefore preferable that components other than the essential components be contained as few as possible, and is more preferable that such component be not contained. Examples of the additional additive include abrasives, an alkali, an antiseptic agent, a dissolved gas, a reducing agent, an oxidant, and an alkanolamine. Specifically, it is preferable that the surface treatment composition contain substantially no abrasives in order to further improve the contaminant removal effect. In the description, "containing substantially no abrasives" means a case in which the content of abrasives is 0.01% by mass or less relative to the total amount of the surface treatment composition.

The number of the above contaminants (organic residues) is a value determined, after surface treatment by the method described in examples, by the method described in examples.

[Method for Producing Surface Treatment Composition]

The surface treatment composition is produced by any production method. For example, the surface treatment composition can be produced by mixing a polymer having a building block represented by Formula (1), a chelating agent containing at least one of a phosphonic acid group and a sulfonic acid group, and water. In other words, according to another embodiment of the present invention, a method for producing the surface treatment composition, including mixing a polymer having a building block represented by Formula (1), a chelating agent containing at least one of a phosphonic acid group and a sulfonic acid group, and water, is also provided. The type, the amount, and the like of the polymer having a building block represented by Formula (1) are as defined above. In the method for producing a surface treatment composition pertaining to an embodiment of the present invention, as needed, the above ionic dispersant, the above water-soluble polymer having a building block derived from glycerol (glycerol type water-soluble polymer), the additional additive, the dispersion medium other than water, or other components may be further mixed. The types, the amounts, and the like of these components are as defined above.

The addition order and the addition methods of the above components are not specifically limited. The above components may be added at once or separately, in a stepwise or continuous manner. The mixing method is also not specifically limited, and a known method can be used. Preferably, the method for producing a surface treatment composition includes sequentially adding a water-soluble polymer having a building block derived from glycerol, an acid, water, and an optional ionic dispersant and stirring them in water. In addition, the method for producing a surface treatment composition may further include determining the pH of the surface treatment composition and adjusting the pH to 5 or less.

[Surface Treatment Method]

Another embodiment of the present invention is a surface treatment method including subjecting an object to be polished after polishing to surface treatment with the above surface treatment composition. In the present description, the surface treatment method is a method for reducing contaminants on the surface of an object to be polished after polishing and is a method of performing cleaning in a broad sense.

By the surface treatment method pertaining to an embodiment of the present invention, contaminants remaining on the surface of an object to be polished after polishing can be sufficiently removed. In other words, according to another embodiment of the present invention, a method for reducing contaminants on the surface of an object to be polished after polishing, by using the above surface treatment composition to perform surface treatment of an object to be polished after polishing is provided.

The surface treatment method pertaining to an embodiment of the present invention is performed by a method of bringing the surface treatment composition pertaining to the present invention into direct contact with an object to be polished after polishing.

Examples of the surface treatment method mainly include (I) a method by rinse polishing treatment and (II) a method by cleaning treatment. In other words, the surface treatment pertaining to an embodiment of the present invention is preferably performed by rinse polishing or cleaning. The rinse polishing treatment and the cleaning treatment are performed to remove contaminants (particles, metal contamination, organic residues, pad dusts, and the like) on the surface of an object to be polished after polishing, thereby giving a clean surface. The above methods (I) and (II) will next be described.

(I) Rinse Polishing Treatment

The surface treatment composition pertaining to the present invention is suitably used in a rinse polishing treatment. The rinse polishing treatment is performed, after final polishing of an object to be polished, on a polishing platen to which a polishing pad is attached, in order to remove contaminants on the surface of the object to be polished. In the treatment, by bringing the surface treatment composition pertaining to the present invention into direct contact with the object to be polished after polishing, the rinse polishing treatment is performed. As a result, contaminants on the surface of the object to be polished after polishing are removed by a frictional force (physical action) by the polishing pad and by chemical action of the surface treatment composition. Of the contaminants, especially particles and organic residues are likely to be removed by the physical action. Hence, in the rinse polishing treatment, use of the friction with a polishing pad on a polishing platen enables effective removal of particles and organic residues.

Specifically, the rinse polishing treatment can be performed as follows: the surface of an object to be polished after polishing, after a polishing step is set on a polishing platen of a polishing machine; then a polishing pad is brought into contact with the polished semiconductor substrate; and the object to be polished after polishing is slid relative to the polishing pad while a surface treatment composition (rinse polishing composition) is supplied to the contact portion therebetween.

The rinse polishing treatment can be performed by using either a single-sided polishing machine or a double-sided polishing machine. The polishing machine preferably includes, in addition to a nozzle for ejecting a polishing composition, a nozzle for ejecting a rinse polishing composition. The operating condition of the polishing machine for the rinse polishing treatment is not specifically limited and can be appropriately set by a person skilled in the art.

(II) Cleaning Treatment

The surface treatment composition pertaining to the present invention is suitably used in a cleaning treatment. The cleaning treatment is performed after final polishing of an object to be polished or after the above rinse polishing treatment, in order to remove contaminants on the surface of the object to be polished. The cleaning treatment and the rinse polishing treatment are classified by place where such treatment is performed, and the cleaning treatment is a surface treatment performed after an object to be polished after polishing is taken out of a polishing platen. The cleaning treatment also enables removal of contaminants on the surface of an object to be polished after polishing by bringing the surface treatment composition pertaining to the present invention into direct contact with the object.

Examples of the method of performing the cleaning treatment include (i) a method in which a cleaning brush is brought into contact with one side or both sides of an object to be polished after polishing while the object to be polished after polishing is held, and the surface of the object to be cleaned is rubbed with the cleaning brush while a surface treatment composition is supplied to the contact portion and (ii) a method (dipping) in which an object to be polished after polishing is immersed in a surface treatment composition, and sonication or stirring is performed. By such a method, contaminants on the surface of an object to be polished are removed by a frictional force by the cleaning brush or a mechanical force generated by the sonication or stirring and by chemical action of the surface treatment composition.

In the method (i), examples of the method of bringing the surface treatment composition (cleaning composition) into contact with an object to be polished after polishing include, but are not necessarily limited to, a spinning process of spinning the object to be polished after polishing at high speed while the surface treatment composition is poured from a nozzle onto the object to be polished after polishing and a spraying process of spraying the surface treatment composition to the object to be polished after polishing for cleaning.

For the cleaning treatment, the spinning process or the spraying process is preferably employed, and the spinning process is more preferably employed, for more efficient contamination removal for a short period.

Examples of the machine for performing such a cleaning treatment include a batch-type cleaning machine in which a plurality of objects to be polished after polishing stored in a cassette are simultaneously subjected to surface treatment and a single wafer cleaning machine in which a single object to be polished after polishing is set to a holder and is subjected to surface treatment. The method using a single wafer cleaning machine is preferred from the viewpoint of shortening the cleaning time.

Another example of the machine for performing the cleaning treatment is a polishing machine equipped with a cleaning apparatus in which an object to be polished after polishing taken out of a polishing platen is rubbed with a cleaning brush. Use of such a polishing machine enables more efficient cleaning treatment of an object to be polished after polishing.

As such a polishing machine, a common polishing machine equipped with a holder for holding an object to be polished after polishing, a motor rotatable at a variable rotation rate, a cleaning brush, and the like can be used. As the polishing machine, either a single-sided polishing machine or a double-sided polishing machine may be used. When a rinse polishing step is performed after a CMP step, the cleaning treatment is more efficiently, preferably performed by using a similar machine to the polishing machine used in the rinse polishing step.

The cleaning brush is not specifically limited, and a resin brush is preferably used. The resin brush may be made from any material, and polyvinyl alcohol (PVA) is preferably used, for example. In addition, as the cleaning brush, a PVA sponge is particularly preferably used.

The cleaning condition is not specifically limited and can be appropriately set depending on the type of an object to be cleaned and the type and amount of organic residues to be removed. For example, the rotation rate of a cleaning brush is preferably 10 rpm or more and 200 rpm or less, the rotation rate of an object to be cleaned is preferably 10 rpm or more and 100 rpm or less, and the pressure (polishing pressure) applied to an object to be cleaned is preferably 0.5 psi or more and 10 psi or less. The method of supplying the surface treatment composition to a cleaning brush is not specifically limited, and a continuous supply method (free-flowing) by a pump or the like is employed, for example. The supply amount is not limited. The cleaning brush and the surface of an object to be cleaned are preferably, constantly covered with the surface treatment composition, and the supply amount is preferably 10 mL/min or more and 5,000 mL/min or less. The cleaning time is not specifically limited, and the time of the step using the surface treatment composition pertaining to an embodiment of the present invention is preferably 5 seconds or more and 180 seconds or less. In such a range, contaminants can be more effectively removed.

The temperature of the surface treatment composition during the cleaning is not specifically limited and can be typically room temperature (25° C.), and the surface treatment composition may be heated at about 40° C. or more and 70° C. or less as long as performances are not impaired.

In the method (ii), the condition of the cleaning method by immersion is not specifically limited, and a known method can be used.

Before, after, or before and after the cleaning treatment by the method (i) or (ii), water cleaning may be performed.

The object to be polished after polishing (object to be cleaned) after cleaning is preferably dried with a spin drier or the like by sweeping water drops adhering to the surface. In addition, the surface of the object to be cleaned may be dried by air blow drying.

[Method for Producing Semiconductor Substrate]

The surface treatment method pertaining to an embodiment of the present invention is suitably applicable when the object to be polished after polishing is a polished semiconductor substrate. In other words, according to another embodiment of the present invention, a method for producing a semiconductor substrate is also provided. In the method, the object to be polished after polishing is a polished semiconductor substrate, and the method includes subjecting the polished semiconductor substrate to surface treatment with the above surface treatment composition.

Details of the semiconductor substrate to which the production method is applied are as described for the object to be polished after polishing to be subjected to surface treatment with the above surface treatment composition.

The method for producing a semiconductor substrate may be any method that includes a step (surface treatment step) of subjecting the surface of a polished semiconductor substrate to surface treatment with the surface treatment composition pertaining to an embodiment of the present invention. Examples of the production method include a method including a polishing step for forming a polished semiconductor substrate and a cleaning step. Another example is a method including, in addition to the polishing step and the cleaning step, a rinse polishing step between the polishing step and the cleaning step. These steps will next be described.

<Polishing Step>

The polishing step that can be included in the method for producing a semiconductor substrate is a step of polishing a semiconductor substrate to form a polished semiconductor substrate.

The polishing step may be any step of polishing a semiconductor substrate and is preferably a chemical mechanical polishing (CMP) step. The polishing step may be a polishing step including a single process or a polishing step including a plurality of processes. Examples of the polishing step including a plurality of processes include a step in which after a stock polishing process (rough polishing process), a final polishing process is performed and a step in which after a first polishing process, a second polishing process is performed once or more times, and then a final polishing process is performed. The surface treatment step using the surface treatment composition pertaining to the present invention is preferably performed after the final polishing process.

As the polishing composition, a known polishing composition can be appropriately used depending on characteristics of a semiconductor substrate. The polishing composition is not specifically limited, and a composition containing abrasives, an acid salt, a dispersion medium, and an acid can be preferably used, for example. Specific examples of the polishing composition include a polishing composition containing ceria, polyacrylic acid, water, and maleic acid.

The polishing machine can be a common polishing machine equipped with a holder for holding an object to be polished, a motor rotatable at a variable rotation rate, and the like and having a polishing platen to which a polishing pad (polishing cloth) can be attached. As the polishing machine, either a single-sided polishing machine or a double-sided polishing machine may be used.

As the polishing pad, a common nonwoven fabric, polyurethane, a porous fluorine resin, and the like can be used without any limitation. In the polishing pad, grooving is preferably performed so as to pool a polishing liquid.

The polishing condition is not specifically limited. For example, the rotation rate of a polishing platen and the rotation rate of a head (carrier) are preferably 10 rpm or more and 100 rpm or less, and the pressure (polishing pressure) applied to an object to be polished is preferably 0.5 psi or more and 10 psi or less. The method of supplying a polishing composition to a polishing pad is not specifically limited, and a continuous supply method (free-flowing) by a pump or the like is employed, for example. The supply amount is not limited. The surface of the polishing pad is preferably, constantly covered with the polishing composition, and the supply amount is preferably 10 mL/min or more and 5,000 mL/min or less. The polishing time is not specifically limited, and the time of the step using the polishing composition is preferably 5 seconds or more and 180 seconds or less.

<Surface Treatment Step>

The surface treatment step is a step of using the surface treatment composition pertaining to the present invention to reduce contaminants on the surface of an object to be polished after polishing. In the method for producing a semiconductor substrate, the cleaning step as the surface treatment step may be performed after the rinse polishing step, or only the rinse polishing step or only the cleaning step may be performed.

(Rinse Polishing Step)

The rinse polishing step may be performed between the polishing step and the cleaning step in the method for producing a semiconductor substrate. The rinse polishing step is a step of reducing contaminants on the surface of an object to be polished after polishing (polished semiconductor substrate) by the surface treatment method (rinse polishing treatment method) pertaining to an embodiment of the present invention.

As the apparatuses including a polishing machine and a polishing pad and as the polishing condition, substantially the same apparatuses and condition as in the above polishing step can be used except that the surface treatment composition pertaining to the present invention is supplied in place of the polishing composition.

Details of the rinse polishing method used in the rinse polishing step are as described in the above rinse polishing treatment.

(Cleaning Step)

The cleaning step may be performed after the polishing step or after the rinse polishing step in the method for producing a semiconductor substrate. The cleaning step is a step of reducing contaminants on the surface of an object to be polished after polishing (polished semiconductor substrate) by the surface treatment method (cleaning method) pertaining to an embodiment of the present invention.

Details of the cleaning method used in the cleaning step is as described in the above cleaning method.

EXAMPLES

The present invention will be described in further detail with reference to examples and comparative examples below. However, the technical scope of the present invention is not necessarily limited to the examples. Unless otherwise specified, "%" and "part" mean "% by mass" and "part by mass", respectively. In the following examples, operations were performed in a condition at room temperature (25° C.) and a relative humidity of 40 to 50% RH unless otherwise specified.

The weight average molecular weight of each polymer compound was the value of a weight average molecular weight (in terms of polyethylene glycol) determined by gel permeation chromatography (GPC) and more specifically determined with the following apparatuses in the following conditions.

GPC apparatus: manufactured by Shimadzu Corporation
Type: Prominence+ELSD detector (ELSD-LTII)
Column: VP-ODS (manufactured by Shimadzu Corporation)
Mobile phase A: MeOH
Mobile phase B: 1% aqueous acetic acid solution
Flow rate: 1 mL/min Detector: ELSD, temp. 40° C., Gain 8, N2GAS 350 kPa
Oven temperature: 40° C.
Injection volume: 40 μL
<Preparation of Surface Treatment Composition>

Example 1: Preparation of Surface Treatment Composition (A-1)

On the basis of 100 parts by mass of the total composition, 0.1 parts by mass of poly-N-vinylacetamide (weight average molecular weight (Mw): 50,000; 100% by mole of building block represented by Formula (1)), 0.01 parts by mass of polystyrene sulfonic acid-acrylic acid copolymer (weight average molecular weight (Mw): 10,000) as an ionic dispersant, and 0.2 parts by mass of 1-hydroxyethylidene-1,1-diphosphonic acid (HEDP) as a chelating agent were mixed with water (deionized water), and ammonia as a pH adjuster was added in such an amount as to give a pH of 3.0, giving a surface treatment composition (A-1). The pH of the surface treatment composition (A-1) (liquid temperature: 25° C.) was determined with a pH meter (manufactured by Horiba, Ltd., product name: LAQUA (registered trademark)).

Examples 2 to 28 and Comparative Examples 1 to 3: Preparation of Surface Treatment Compositions (A-2) to (A-28) and (a-1) to (a-3)

The same procedure as in Example 1 was performed except that components of such types having such molecular weights were used at such contents as listed in Table 1, and the pH of each surface treatment composition was adjusted to such pH as listed in Table 1, giving surface treatment compositions. In Table 1, "-" means that the corresponding component was not used.

In Table 1, PSS-PA represents "polystyrene sulfonic acid-acrylic acid copolymer". In Table 1, PNVA represent "poly-N-vinylacetamide".

The chelating agent pertaining to embodiments of the present invention has a total number of groups of phosphoric acid group and carboxylic acid group of 2 or more. The chelating agents used in Examples 1 to 28 each satisfy the condition. Phosphoric acid and acetic acid used in Comparative Examples 1 and 2 do not satisfy the condition and are not the chelating agent. In Comparative Example 3, neither the chelating agent nor phosphoric acid nor acetic acid was added.

<Evaluation>
<Preparation of Object to be Polished after Polishing (Object to be Surface-Treated)>

A polished TEOS substrate, a polished silicon nitride substrate, a polished polysilicon substrate, and a polished bare silicon substrate after polishing through the following chemical mechanical polishing (CMP) step, or as needed, a polished TEOS substrate, a polished silicon nitride substrate, a polished polysilicon substrate, and a polished bare silicon substrate after further treatment through the following rinse polishing treatment step were prepared as objects to be surface-treated.

[CMP Step]
A TEOS substrate, a silicon nitride substrate, and a polysilicon substrate as semiconductor substrates were polished by using a polishing composition M (formulation: 1% by mass of ceria having a primary particle diameter of 60 nm and a secondary particle diameter of 100 nm, 0.18% by mass of aqueous maleic acid solution having a concentration of 30% by mass, 0.25% by mass of polyacrylic acid (molecular weight: 6,000), and water as a solvent), in the following conditions. As the TEOS substrate, the silicon nitride substrate, the polysilicon substrate, and the polished bare silicon substrate, 300-mm wafers were used.

(Polishing Machine and Polishing Conditions)
Polishing machine: FREX 300E manufactured by Ebara Corporation
Polishing pad: Soft pad H800 manufactured by Fujibo
Polishing pressure: 2.0 psi (1 psi=6,894.76 Pa, the same applies hereinafter)
Polishing platen rotation rate: 90 rpm
Head rotation rate: 90 rpm
Polishing composition supply: free-flowing
Polishing composition supply amount: 200 mL/min
Polishing time: 60 seconds
[Rinse Polishing Treatment Step]

The polished TEOS substrate, the polished silicon nitride substrate, the polished polysilicon substrate, and the polished bare silicon substrate after polishing through the above CMP step were each taken out of the polishing platen. Subsequently, in the same polishing machine, each polished substrate was attached to another polishing platen, and the substrate surface was subjected to rinse polishing treatment by using the respective surface treatment compositions prepared above, in the following conditions.

(Polishing Machine and Polishing Conditions)
Polishing machine: FREX 300E manufactured by Ebara Corporation
Polishing pad: Soft pad H800 manufactured by Fujibo
Polishing pressure: 1.0 psi (1 psi=6,894.76 Pa, the same applies hereinafter)
Polishing platen rotation rate: 60 rpm
Head rotation rate: 60 rpm
Polishing composition supply: free-flowing
Polishing composition supply amount: 300 mL/min
Polishing time: 60 seconds
(Water Cleaning Step)

Each substrate after the rinse polishing treatment was cleaned with a PVA brush in a cleaning unit for 60 seconds while deionized water (DIW) was poured. The substrate was then dried with a spin drier for 30 seconds.

<Evaluation>

Each substrate after the water cleaning step was subjected to the following measurements and was evaluated. The evaluation results are listed in Table 2.

[Measurement of Ce Dissolution Amount]
To evaluate the ceria removal performance, the Ce dissolution amount of each substrate was determined. A larger dissolution amount of Ce indicates a higher removal performance of ceria particles. The measurement method of Ce dissolution amount is as described below.

An evaluation sample contained 1 part by mass of ceria particles (a particle diameter of 60 nm) and a chelating agent and was adjusted at a pH of 3.5 with a pH adjuster.

The prepared sample liquid was stirred at room temperature under normal pressure at 500 rpm for 2 hours. About 35 g of the sample was then placed in a centrifugal vial and centrifuged at 20,000 rpm for 2 hours (Avanti HP-301, manufactured by Beckman coulter). The supernatant liquid was next separated and filtered through a filter having a pore size of 0.1 μm, then 10 mL of the filtrate was diluted 5-fold, and the diluted liquid was analyzed by ICP.

[Measurement of Total Number of Defects]
The numbers of defects on the surface-treated TEOS substrate (0.037 μm or more), the surface-treated silicon nitride substrate (0.038 μm or more), the surface-treated polysilicon substrate (0.057 μm or more), and the surface-treated, polished bare silicon substrate (0.060 μm or more)) each after the water cleaning step were determined. To determine the number of defects, a wafer defect tester SP-5 manufactured by KLA TENCOR was used. The measurement was performed in an area on each surface of the surface-treated substrates except the margin having a width of 3 mm from the peripheral edge (except the area from a width of 0 mm to a width of 3 mm where the peripheral edge has a width of 0 mm).

[Measurement of Number of Dent Defects on Si]

The number of dent defects on the surface-treated bare silicon substrate was determined by SEM observation by using FE-SEM (SU-8000), Hitachi High-Tech Corporation. In the SEM observation, the number of dents was visually determined in a measurement area at 1.0 kV, 8.0 mm×50.0 k, SE (UL) fold. A dent having a diameter of 50 to 100 nm was defined as the dent defect. When the average number of dents observed in 30 visual fields on Si was 10 or less, such a sample was evaluated as good.

[Evaluation of Number of Organic Residues]

The number of organic residues on a surface-treated object to be polished after polishing was determined by SEM observation by using Review SEM RS6000 manufactured by Hitachi, Ltd. First, 100 defects were sampled under SEM observation from an area on one face of an object to be polished after polishing except the margin having a width of 3 mm from the peripheral edge. Next, of the 100 sampled defects, organic residues were visually determined under SEM observation, then the number was counted, and the proportion (%) of the organic residues in the defects was calculated. Next, the product of the total number of defects (pieces) on each of the TEOS substrate (0.037 μm or more), the silicon nitride substrate (0.038 μm or more), the polysilicon substrate (0.057 μm or more), and the polished bare silicon substrate (0.060 μm or more) determined by using SP-5 manufactured by KLA TENCOR in the above evaluation of the total number of defects, by the proportion (%) of the organic residues in the defects calculated from the above SEM observation result was calculated as the number of organic residues (pieces).

The proportion (%) of the organic residues in the defects was 10% on the TEOS substrate, 10% on the silicon nitride (SiN) substrate, 90% on the polysilicon substrate, or 90% on the polished bare silicon substrate. The reduction of the number of organic residues was evaluated as good when the number was 15,000 or less on a TEOS substrate, 3,000 or less on a silicon nitride substrate, 5,000 or less on a polysilicon substrate, or 5,000 or less on a bare silicon substrate.

The evaluation results of organic residues by each surface treatment composition when the polished TEOS substrate, the polished silicon nitride substrate, and the polished polysilicon substrate were used as the object to be surface-treated are listed in Table 2.

TABLE 1

| | Ionic dispersant | | | Vinyl polymer | | | Chelating agent | | | pH adjuster | Physical properties |
|---|---|---|---|---|---|---|---|---|---|---|---|
| | Compound | Molecular weight | Concentration [g/kg] | Compound | Molecular weight | Concentration [g/kg] | Compound | Phosphonic acid group number/ Carboxylic acid group number | Concentration [mmol/kg] | Component | pH |
| Ex. 1 (A-1) | PSS-PA | 10000 | 0.1 | PNVA | 50000 | 1.3 | 1-Hydroxyethylidene-1,1-diphosphonic acid (HEDP) | 2/0 | 10 | Ammonia | 3.0 |
| Ex. 2 (A-2) | PSS-PA | 10000 | 0.1 | PNVA | 50000 | 1.3 | 1-Hydroxyethylidene-1,1-diphosphonic acid (HEDP) | 2/0 | 1 | — | 3.0 |
| Ex. 3 (A-3) | PSS-PA | 10000 | 0.1 | PNVA | 50000 | 1.3 | Nitrilotris(methylene-phosphonic acid) (ATMP) | 3/0 | 10 | Ammonia | 3.0 |
| Ex. 4 (A-4) | PSS-PA | 10000 | 0.1 | PNVA | 50000 | 1.3 | Ethylenediamine tetra(methylenephosphonic acid) (EDTMP) | 4/0 | 10 | Ammonia | 3.0 |
| Ex. 5 (A-5) | PSS-PA | 10000 | 0.1 | PNVA | 50000 | 1.3 | Sodium hexametaphosphate | 6/0 | 10 | Ammonia | 3.0 |
| Ex. 6 (A-6) | PSS-PA | 10000 | 0.1 | PNVA | 50000 | 1.3 | 2-Phosphonobutane-1,2,4-tricarboxylic acid (PBTC) | 1/3 | 10 | Ammonia | 3.0 |
| Ex. 7 (A-7) | PSS-PA | 10000 | 0.1 | PNVA | 50000 | 1.3 | Triethylenetetramine-hexaacetic acid (TTHA) | 0/6 | 10 | Ammonia | 3.0 |
| Ex. 8 (A-8) | PSS-PA | 10000 | 0.1 | PNVA | 50000 | 1.3 | Ethylenediaminetetra-acetic acid (EDTA) | 0/4 | 10 | Ammonia | 3.0 |
| Ex. 9 (A-9) | PSS-PA | 10000 | 0.1 | PNVA | 50000 | 1.3 | Diethylenetriamine-pentaacetic acid (DTPA) | 0/5 | 10 | Ammonia | 3.0 |
| Ex. 10 (A-10) | PSS-PA | 10000 | 0.1 | PNVA | 50000 | 1.3 | Ethylenediamine-N,N'-disuccinic acid (EDDS) | 0/4 | 10 | Ammonia | 3.0 |
| Ex. 11 (A-11) | PSS-PA | 10000 | 0.1 | PNVA | 50000 | 1.3 | Succinic acid | 0/2 | 10 | Ammonia | 3.0 |
| Ex. 12 (A-12) | PSS-PA | 10000 | 0.1 | PNVA | 50000 | 1.3 | Glutaric acid | 0/2 | 10 | Ammonia | 3.0 |
| Ex. 13 (A-13) | PSS-PA | 10000 | 0.1 | PNVA | 50000 | 1.3 | Citric acid | 0/3 | 10 | Ammonia | 3.0 |
| Ex. 14 (A-14) | PSS-PA | 10000 | 0.1 | PNVA | 50000 | 1.3 | Mercaptosuccinic acid | 0/2 | 50 | Nitric acid | 3.0 |
| Ex. 15 (A-15) | — | — | — | PNVA | 50000 | 1.3 | 1-Hydroxyethylidene-1,1-diphosphonic acid (HEDP) | 2/0 | 10 | Ammonia | 3.0 |
| Ex. 16 (A-16) | — | — | — | PNVA | 50000 | 1.3 | 1-Hydroxyethylidene-1,1-diphosphonic acid (HEDP) | 2/0 | 1 | — | 3.0 |
| Ex. 17 (A-17) | — | — | — | PNVA | 50000 | 1.3 | Nitrilotris(methylene-phosphonic acid) (ATMP) | 3/0 | 10 | Ammonia | 3.0 |

TABLE 1-continued

| | Ionic dispersant | | | Vinyl polymer | | | Chelating agent | | | pH adjuster | Physical properties |
| | Compound | Molecular weight | Concentration [g/kg] | Compound | Molecular weight | Concentration [g/kg] | Compound | Phosphonic acid group number/ Carboxylic acid group number | Concentration [mmol/kg] | Component | pH |
|---|---|---|---|---|---|---|---|---|---|---|---|
| Ex. 18 (A-18) | — | — | — | PNVA | 50000 | 1.3 | Ethylenediamine tetra(methyl-enephosphonic acid) (EDTMP) | 4/0 | 10 | Ammonia | 3.0 |
| Ex. 19 (A-19) | — | — | — | PNVA | 50000 | 1.3 | Sodium hexametaphosphate | 6/0 | 10 | Ammonia | 3.0 |
| Ex. 20 (A-20) | — | — | — | PNVA | 50000 | 1.3 | 2-Phosphonobutane-1,2,4-tricarboxylic acid (PBTC) | 1/3 | 10 | Ammonia | 3.0 |
| Ex. 21 (A-21) | — | — | — | PNVA | 50000 | 1.3 | Triethylenetetramine-hexaacetic acid (TTHA) | 0/6 | 10 | Ammonia | 3.0 |
| Ex. 22 (A-22) | — | — | — | PNVA | 50000 | 1.3 | Ethylenediaminetetra-acetic acid (EDTA) | 0/4 | 10 | Ammonia | 3.0 |
| Ex. 23 (A-23) | — | — | — | PNVA | 50000 | 1.3 | Diethylenetriamine-pentaacetic acid (DTPA) | 0/5 | 10 | Ammonia | 3.0 |
| Ex. 24 (A-24) | — | — | — | PNVA | 50000 | 1.3 | Ethylenediamine-N,N'-disuccinic acid (EDDS) | 0/4 | 10 | Ammonia | 3.0 |
| Ex. 25 (A-25) | — | — | — | PNVA | 50000 | 1.3 | Succinic acid | 0/2 | 10 | Ammonia | 3.0 |
| Ex. 26 (A-26) | — | — | — | PNVA | 50000 | 1.3 | Glutaric acid | 0/2 | 10 | Ammonia | 3.0 |
| Ex. 27 (A-27) | — | — | — | PNVA | 50000 | 1.3 | Citric acid | 0/3 | 10 | Ammonia | 3.0 |
| Ex. 28 (A-28) | — | — | — | PNVA | 50000 | 1.3 | Mercaptosuccinic acid | 0/2 | 50 | Nitric acid | 3.0 |
| Comp. Ex. 1 (a-1) | PSS-PA | 10000 | 0.1 | PNVA | 50000 | 1.3 | Phosphoric acid (not chelating agent) | 1/0 | 10 | Ammonia | 3.0 |
| Comp. Ex. 2 (a-2) | PSS-PA | 10000 | 0.1 | PNVA | 50000 | 1.3 | Acetic acid (not chelating agent) | 0/1 | 10 | Nitric acid | 3.0 |
| Comp. Ex. 3 (a-3) | PSS-PA | 10000 | 0.1 | PNVA | 50000 | 1.3 | — | — | — | Nitric acid | 3.0 |

TABLE 2

| | Ce dissolution amount [ppb] | Number of defects [pieces/wafer] | | | | Number of dent defects on Si |
|---|---|---|---|---|---|---|
| | | TEOS | SiN | Poly Si | Bare Si | |
| Ex. 1 (A-1) | 63.3 | 7653 | 1831 | 3358 | 3861 | 4 |
| Ex. 2 (A-2) | 45.4 | 7715 | 1864 | 3396 | 3848 | 4 |
| Ex. 3 (A-3) | 70.8 | 8949 | 1229 | 3871 | 4232 | 4 |
| Ex. 4 (A-4) | 189.4 | 5112 | 1247 | 4377 | 2347 | 2 |
| Ex. 5 (A-5) | 209.0 | 6893 | 1645 | 4343 | 2378 | 2 |
| Ex. 6 (A-6) | 86.9 | 7305 | 1672 | 4110 | 2812 | 4 |
| Ex. 7 (A-7) | 8.3 | 12015 | 1991 | 4920 | 4691 | >10 |
| Ex. 8 (A-8) | 7 | 12761 | 2015 | 5576 | 4643 | >10 |
| Ex. 9 (A-9) | 8.3 | 13543 | 2637 | 6124 | 5035 | >10 |
| Ex. 10 (A-10) | 8.4 | 12098 | 2511 | 5980 | 5112 | >10 |
| Ex. 11 (A-11) | 12.1 | 11374 | 2755 | 3038 | 5622 | >10 |
| Ex. 12 (A-12) | 6.5 | 15039 | 2643 | 3214 | 7834 | >10 |
| Ex. 13 (A-13) | 12.6 | 13760 | 2091 | 3600 | 6627 | >10 |
| Ex. 14 (A-14) | 7 | 15389 | 2068 | 3794 | 4306 | >10 |
| Ex. 15 (A-15) | 63.3 | 7594 | >50000 | 3291 | 3739 | 4 |
| Ex. 16 (A-16) | 45.4 | 7812 | >50000 | 3035 | 4136 | 4 |
| Ex. 17 (A-17) | 70.8 | 7957 | >50000 | 3485 | 4210 | 4 |
| Ex. 18 (A-18) | 189.4 | 5617 | >50000 | 3011 | 2663 | 2 |
| Ex. 19 (A-19) | 209.0 | 6677 | >50000 | 4138 | 2354 | 2 |
| Ex. 20 (A-20) | 86.9 | 7643 | >50000 | 3088 | 3001 | 4 |
| Ex. 21 (A-21) | 8.3 | 13630 | >50000 | 4423 | 4109 | >10 |
| Ex. 22 (A-22) | 7 | 12763 | >50000 | 4159 | 6122 | >10 |
| Ex. 23 (A-23) | 8.3 | 12910 | >50000 | 4213 | 6279 | >10 |
| Ex. 24 (A-24) | 8.4 | 10845 | >50000 | 5614 | 6578 | >10 |
| Ex. 25 (A-25) | 12.1 | 11211 | >50000 | 4111 | 5725 | >10 |
| Ex. 26 (A-26) | 6.5 | 13349 | >50000 | 3216 | 5441 | >10 |
| Ex. 27 (A-27) | 12.6 | 12093 | >50000 | 3388 | 6035 | >10 |
| Ex. 28 (A-28) | 7 | 13772 | >50000 | 4095 | 4074 | >10 |
| Comp. Ex. 1 (a-1) | 3.6 | 18268 | 2133 | 3555 | 6952 | >10 |
| Comp. Ex. 2 (a-2) | 1.1 | 19254 | 2924 | 3916 | 6313 | >10 |
| Comp. Ex. 3 (a-3) | 0.2 | 17249 | 2633 | 4086 | 6547 | >10 |

Table 1 and Table 2 have revealed that the surface treatment compositions in Examples can reduce ceria particles and organic residues on the surface of an object to be polished after polishing as compared with the surface treatment compositions in Comparative Examples.

Specifically, it has been revealed that the surface treatment compositions containing a chelating agent having a total number of groups of phosphonic acid group and carboxylic acid group of 2 or more in Examples 1 to 28 can remove ceria and can reduce organic residues on the surface of the polished TEOS substrate as compared with the surface treatment compositions in Comparative Examples 1 to 3.

It has also been revealed that the surface treatment compositions containing a phosphonic acid chelating agent in Examples 1 to 6 and 15 to 20 can more effectively remove ceria particles and can more effectively reduce organic residues on the surface of the polished TEOS substrate. In addition, these surface treatment compositions in Examples 1 to 6 and 15 to 20 can reduce the number of dent defects on Si.

The surface treatment compositions containing polystyrene sulfonic acid-acrylic acid copolymer in Examples 1 to 14 can reduce organic residues not only on the surface of the polished TEOS substrate but also on the surface of the polished silicon nitride substrate.

The invention claimed is:

1. A surface treatment composition comprising:
a polymer having a building block represented by Formula (1);
a chelating agent;
an ionic dispersant, wherein the ionic dispersant is a copolymer consisting of monomers of a polystyrene sulfonic acid (or a salt thereof) and monomers of a polyacrylic acid; and
water,
the surface treatment composition being used to treat a surface of an object to be polished after polishing,

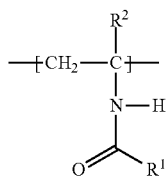
(1)

wherein in Formula (1), $R^1$ is a hydrocarbon group having 1 to 5 carbon atoms, and $R^2$ is a hydrogen atom or a hydrocarbon group having 1 to 3 carbon atoms; and
wherein the chelating agent has at least one of a phosphonic acid group or a carboxylic acid group.

2. The surface treatment composition according to claim 1, wherein the chelating agent has a total number of groups of the phosphonic acid group and the carboxylic acid group of 2 or more.

3. The surface treatment composition according to claim 1, having a pH of 5 or less.

4. The surface treatment composition according to claim 1, having a pH of 3 or less.

5. The surface treatment composition according to claim 1, wherein the composition is substantially free of abrasives.

6. A surface treatment method comprising:
subjecting an object to be polished after polishing to surface treatment with the surface treatment composition according to claim 1 to reduce an organic residue on a surface of the object to be polished after polishing.

7. The method according to claim 6, wherein the object to be polished after polishing contains silicon oxide.

8. The method according to claim 6, wherein the object to be polished after polishing contains silicon nitride.

9. A method for producing a surface treatment composition, the method comprising:
mixing a polymer having a building block represented by Formula (1), a chelating agent, an ionic dispersant, and water,

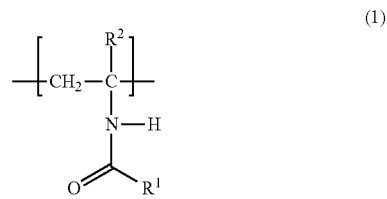
(1)

wherein in Formula (1), $R^1$ is a hydrocarbon group having 1 to 5 carbon atoms; and $R^2$ is a hydrogen atom or a hydrocarbon group having 1 to 3 carbon atoms;
wherein the ionic dispersant is a copolymer consisting of monomers of a polystyrene sulfonic acid (or salt thereof) and monomers of a polyacrylic acid; and
wherein the chelating agent has at least one of a phosphonic acid group or a carboxylic acid group.

10. The surface treatment method according to claim 6, wherein the surface treatment includes rinse polishing or cleaning.

11. A method for producing a semiconductor substrate, the method comprising:
a surface treatment step by the surface treatment method according to claim 6 to reduce an organic residue on a surface of an object to be polished after polishing, wherein
the object to be polished after polishing is a polished semiconductor substrate.

12. The surface treatment composition according to claim 2, having a pH of 5 or less.

13. The surface treatment composition according to claim 2, having a pH of 3 or less.

14. The surface treatment composition according to claim 3, having a pH of 3 or less.

15. The surface treatment composition according to claim 2, wherein the composition is substantially free of abrasives.

16. The surface treatment composition according to claim 1, wherein the chelating agent is hydroxyethylidene-1,1-diphosphonic acid (HEDP).

17. The surface treatment composition according to claim 1, wherein the chelating agent comprises 4 or more phosphonic acid groups.

18. The surface treatment composition according to claim 1, wherein the chelating agent comprises 2 to 6 phosphonic acid groups.

19. The method according to claim 9, wherein the chelating agent is hydroxyethylidene-1,1-diphosphonic acid (HEDP).

20. The method according to claim 9, wherein the chelating agent comprises 4 or more phosphonic acid groups.

* * * * *